INVENTOR
ALFRED J. GALE
BY Francis J. Thornton
ATTORNEY

FABRICATING SOLID STATE DEVICES BY ION IMPLANTATION

Filed Oct. 6, 1965

INVENTOR
ALFRED J. GALE
BY Francis J. Thornton
ATTORNEY

INVENTOR
ALFRED J. GALE
BY Francis J. Thornton
ATTORNEY

United States Patent Office 3,434,894
Patented Mar. 25, 1969

3,434,894

FABRICATING SOLID STATE DEVICES BY ION IMPLANTATION

Alfred J. Gale, Lexington, Mass., assignor to Ion Physics Corporation, Burlington, Mass., a corporation of Delaware Filed Oct. 6, 1965, Ser. No. 493,484
Int. Cl. H01l 7/54
U.S. Cl. 148—187 6 Claims

ABSTRACT OF THE DISCLOSURE

A method of performing ion beam implantation in an economical fashion to produce a complete electrical circuit in a semiconductor substrate comprising generating a charged particle beam, focusing and analyzing the beam, passing the beam through a mask, passing the analyzed and focused beam through a deflection system and an electrostatic lens system to attain at the surface of the material being worked a spatial resolution determined by the size of the mask and the reduction provided in the lens system and the control applied to the deflection thereby avoiding the problems associated with mechanical registration and transcending the limits imposed by either mechanical or optical resolution and the apparatus for performing this.

This invention relates generally to charge particle beam techniques and devices and more particularly to a method and apparatus for solid state device fabrication by ion implantation.

Ion implantation apparatus has been described in the prior are and used in practical applications. These prior art devices have been limited to implanting relatively large areas and have therefore been limited to producing devices and integrated circuits whose geometry is determined by masking techniques. Such techniques generally limit the surface resolution to about 10 microns, for the mechanical difficulties in producing openings in the mask of less than 10 microns are severe and as a practical matter impossible to overcome. Still further when the device being irradiated requires that more than one mask be used, the alignment problem may prove impossible to overcome using present optical registration techniques.

For example, the so-called planar process, of solid state device production, requires first the growth of an oxide on the solid state substrate, next, the overlaying of photoresist material, then the exposure of the photoresist through an appropriate mask to optical radiation. This exposure to radiation then permits removal of the photoresist in selected areas. The underlying oxide is also removed by chemical etching techniques followed by the diffusion of appropriate dopant into the solid state substrate. Subsequent doping required in the fabrication of most devices requires the removal of the remaining photoresist, regrowth of the oxide and the repetition of the previously mentioned steps. Obviously, the many process steps, in which mechanical transfer of the substrate is involved, between the repeated exposures limit the resolution obtainable for diffused areas.

The practical, optical resolution limitations of this process result in limited component density, expensive products, and fail to produce devices having the requisite frequency characteristics and density now required by the more sophisticated electronic systems.

The present invention is directed toward a method capable of overcoming these limitations of spatial resolution imposed by the existing prior art techniques.

Broadly speaking, these and other advantages are obtained in the present invention by providing a method that utilizes particle beam technology by generating a particle beam, accelerating it, defining it and manipulating it to implant in a semiconductor substrate selected ions.

More particularly, the extracted beam is analyzed and focused onto a single aperture. After passing through the aperture, the beam is acted upon by a charged particle optical system comprised of one or more lenses and deflection systems. Preferably, though not necessarily, these systems are electrostatic to obtain at the substrate surface a spatial resolution of the implanted region determined by the size of the aperture, the reduction provided by the lens system, and the control applied to the deflection system.

The invention, in order to obviate the problems of mechanical transfer and/or masking, is capable of passing two or more charged particle beams through the same lens or lenses and deflection systems.

The invention can use various ions and can also use electrons, since the control and focusing of the beam is in most cases independent of the nature of the particle in the beam and dependent in the electrostatic case only upon the energy of the beam.

The described features and advantages of the invention will become more readily apparent from the following detailed description thereof, when read with reference to the accompanying drawings in which:

FIG. 11 is a plan view of a mask used with the apparatus of FIG. 10.

Figures 1, 3, 4, 5:
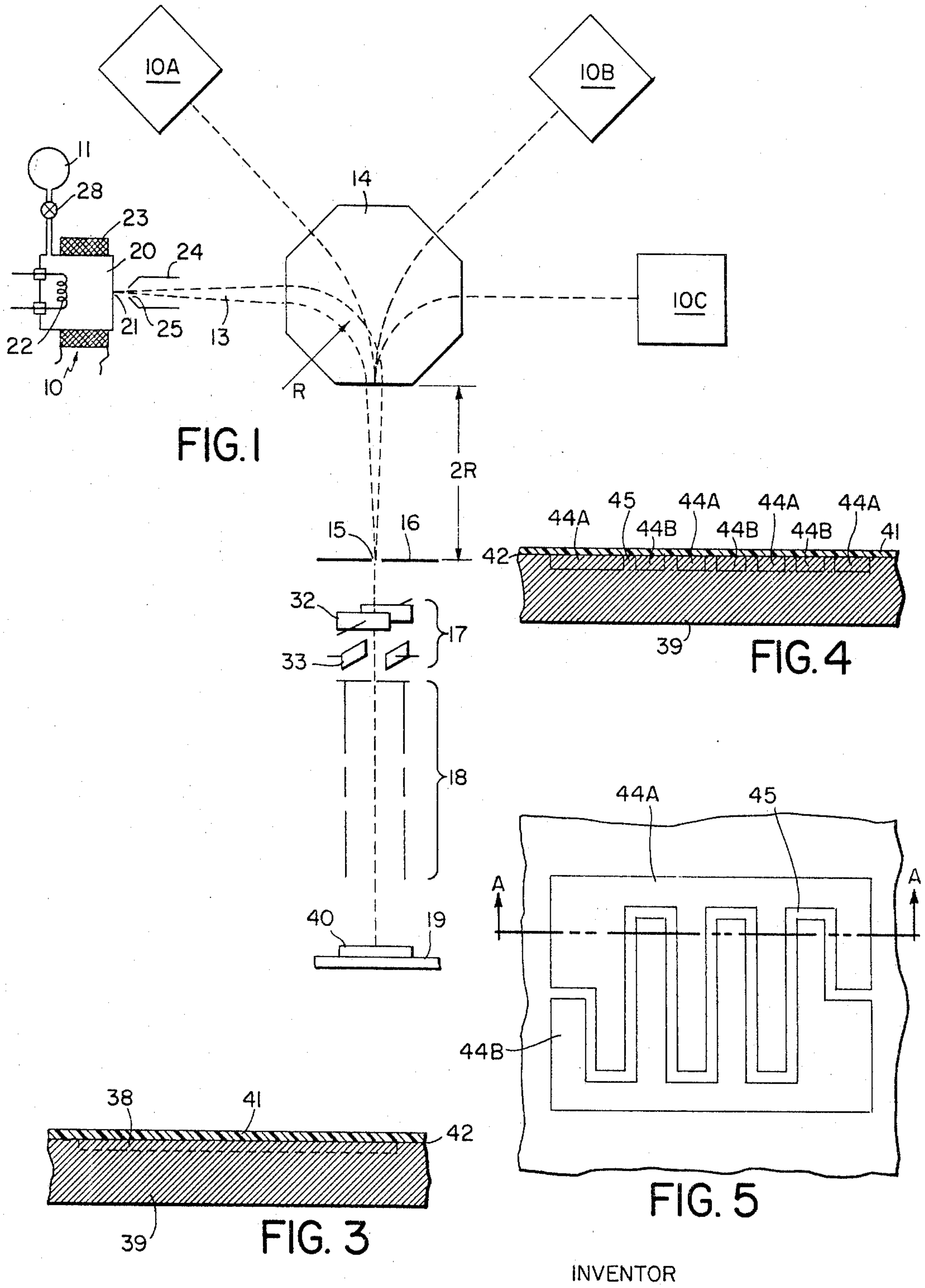
FIGURE 1 is a schematic view of one embodiment of the apparatus of the invention.
FIG. 3 is a sectional view of a typical oxidized slice of semiconductor material.
FIG. 4 is a sectional view of the slice of FIG. 3 after ions have been implanted in discrete areas.
FIG. 5 is a top view of FIG. 4.

A full appreciation of the features and advantages of the present invention can best be gained by reference to the drawings and more particularly to FIGURE 1, which illustrates in schematic form one embodiment of the apparatus of the present invention. The basic elements of the apparatus includes a number of ion sources indicated generally as 10, 10*a*, 10*b*, 10*c*, etc., each having coupled thereto a gas container 11, 11*a*, 11*b*, 11*c*, etc., arranged to be capable of introducing into the appropriate ion source the gas to be ionized. As an alternate to the gas source 11, any or all of the ion sources may contain a vaporizable pellet of the desired elemental material. A number of techniques used in mass spectrometry are applicable to the apparatus of the invention. Since all the sources are identical, only source 10 is shown in detail and described. The ion beam 13 is extracted from the source 10 by known techniques, momentum analyzed, by double focusing analyzing magnet 14, passed through an aperture 15 in plate 16, a deflection system 17 and an electrostatic lens assembly 18 to the sample 40, that is to be irradiated. Sample 40 is maintained in the beam by being placed on a sample holder 19 secured to suitable supports (not shown). The entire apparatus briefly described above is contained within a casing (not shown) to provide a highly evacuated environment and to confine stray irradiation. The pumping system required to maintain an adequate vacuum also is not shown.

More specifically, the ion sources 10 are plasma generators from which ions may be extracted. Such sources are well known for use in particle spectrometers and particle accelerators. A common form is known to the art as an electron bombardment ion source. Since such sources are well known in the prior art, only a brief description of its rudimentary features will be given.

Basically, an electron bombardment ion source consists of an envelope of chamber 20 having at one end an aperture 21. Within the chamber is a heated cathode or a filamentary source of electrons 22. Positioned in front of the chamber 20 is an extraction electrode 24 having an aperture 25 in substantial alignment with aperture 21. When the gas from container 11 is permitted to enter the chamber 20 by opening flow regulator valve 28, an electric arc is initiated between the electron emitter cathode 22 and the chamber 20 by lowering the potential of the cathode to about 50 volts below the potential of the chamber wall. That is the cathode is now negative relative to the chamber wall. These potentials are maintained by any suitable power source (not shown) which is capable of supplying the arc current requirements of about 1 ampere. The arc thus generated is confined by passing current through the coil 23 to establish a relatively weak magnetic field, on the order of about 400 gauss, within the chamber 20. At the aperture 21, a plasma cup is formed within the chamber 20 from which ions may be extracted by elevating the associated structure to a suitable positive potential relative to the extraction electrode 24 by a suitable power supply (not shown). The extraction electrode 24 and all subsequent elements of the beam manipulating system, including the irradiated substrate 40 on sample holder 19, are preferably, though not necessarily, held at ground potential. The extraction potential may range from several kilovolts to several hundred kilovolts, depending on the process step. When the potential is more than a few 10's of kilovolts, a graded extraction structure in the form of an acceleration tube is usually employed. The potential difference between the walls of chamber 20 and the electrode 24 directs the ion beam 13 through the aperture 25 toward the magnet 14 which serves to direct the wanted ions from the ion source to orifice 15 in plate 16. In FIGURE 1, the required beam from source 10*a* is shown as being deflected through an angle close to 90°. Lighter ions will be deflected through a larger angle and heavy ions through a lesser angle and thus will not pass through aperture 15. A further feature of magnet 14 is to focus the beam in parallel and perpendicular planes to the plane of the diagram onto the orifice 15. This increases the rejection of unwanted ions and also maximizes the current density at orifice 15.

After the beam 13 passes through orifice 15, it is focused by electrostatic lens system 18 which produces an image of orifice 15 on the substrate 40. An important feature of an electrostatic lens system is that the potential which is to be supplied to the lens elements is in direct proportion, except for relativistic particles, to the energy of the particles, and independent of the particle species. Thus, the potentials to be supplied to the elements of lens 18 are directly proportional to the extraction potential between source 10 and extraction electrode 24. This feature materially assists in the automation of the various process steps. In some process steps, it may be necessary to use energetic electrons and in which case relativistic effects may enter. In this case, there is a departure from the proportionality feature described above. The departure is, however, calculated so that automatic operation may be achieved but with some greater complexity. Magnetic ion optical systems could also be used but with the other disadvantage that the focusing and deflection parameters are particle species as well as particle energy dependent. A particularly undesirable feature of magnetic systems is that the different isotopes of the same ion species are focused at different positions.

An important feature of the apparatus of the invention is that except for minor corrections, the position of the image at the substrate is independent of the angle that the beam 13 approaches orifice 15. Thus, the beams from the various sources 10 do not have to approach the aperture along the same precisely defined path. The size of the beam spot at substrate 40 is dependent upon the size of orifice 15 and the reduction provided by lens 18. The quality of the spot variation is dependent upon the mechanical integrity and electrical integrity of lens 18. The deflection system 17 serves to alter the position of the beam spot on the substrate in a controllable manner. The system 17 is a typical charge particle beam deflection arrangement as may be found in cathode ray tubes and the like and consists of two sets of plates 32 and 33 perpendicular to one another. In principle, the deflection system 17 may be placed either before or after the lens 18 or even within it. It is shown before the lens system in this view, since lens 18 was described as a reducing lens, which has an object distance greater than the image distance. Application of suitable potentials to the deflection electrode plates 32 and 33 controllably alter the vertical position of the aperture image on the surface of substrate 40.

By means of the described apparatus, any desired pattern within certain geometrical limits may be "written" on the surface of the substrate 40. As with the lens, only the proportionality between deflection electrode potential and extraction potential determine the displacement of the spot from the undeflected position. Ion species and the angle of approach of beam 13 to aperture 15 do not enter into the displacement equations.

Furthermore, by controllably switching on the arc current of the source 10, the "written" pattern may be produced in the form of discrete dots, overlapping dots, discrete lines, overlapping lines, and broad areas. Since the sources may be switched in periods comparable with one microsecond, the patterns may be produced at very high rates.

Figures 2, 6, 7, 8:
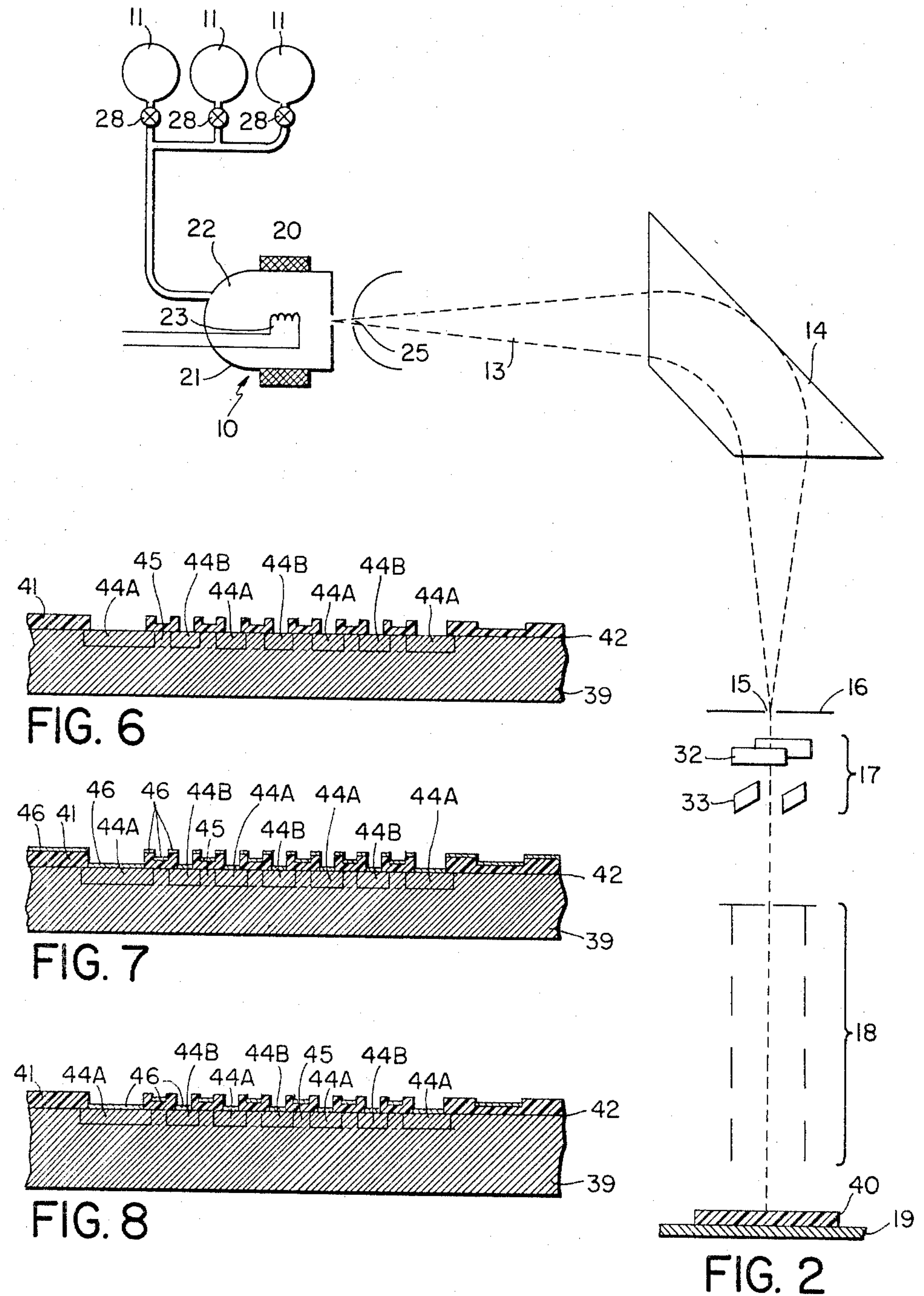
FIG. 2 is a schematic view of an alternate embodiment of the apparatus of the invention.
FIG. 6 is a sectional view of the device of FIG. 4, after oxides have been selectively removed by charge particle beam techniques.
FIG. 7 is a sectional view of the device after metallizing.
FIG. 8 is a sectional view of the device after unwanted metal has been removed.

In some instances, it may be preferable to use fewer sources and to feed a suitable source with one or more gases. Such an arrangement is shown in FIG. 2, in which source 10 is shown as having a number of gas containers 11 selectively coupled to it through flow regulating valves 28. In all other respects, the apparatus is identical with that of FIGURE 1.

One highly practical use of the described invention can be fully appreciated by the following discussion given with reference to FIGS. 3 through 10, which describes fabrication of a semiconductor device. It should, however, be fully understood that such a discussion is not to be considered as limiting the use of the invention but only illustrative and the to-be-described technique of charge particle beam fabrication is applicable not only to discrete semiconductor devices but also to integrated circuits, molecular electronics and other products. In FIG. 3, there is shown a section of a single crystal silicon slice 39 on which a passivating layer of silicon dioxide 41, approximately 1,000 angstroms thick, has been formed by known methods on its upper surface 42. For purpose of illustration only, it will be assumed that the silicon crystal is P-type material doped to a level of about $1.4 \times 10^{15}$ impurity atoms per cubic centimeter. Following oxidation, the prepared slice is fixed on the holder 19 by means of a suitable adhesive, such as silicone grease. The holder 19 is then placed in the apparatus of FIGS. 1 or 2 and the dopant level of region 38 is raised to about $2.8 \times 10^{15}$ atoms per cubic centimeter. Preferably, region 38 has an area 240 microns by 160 microns and a depth of 0.5 micron by bombardment with a P-type ion beam. If lens 18 has a reduction ratio, for example of 10 to 1, and aperture 15 is 10 microns square, then an image one micron square would be produced at the substrate surface. Therefore, the area is implanted by "writing" 160 adjacent lines each 240 microns long. To obtain satisfactory depth distribution, three different energies of boron beam would be selected approximately 120 kev., 80 kev. and 40 kev., respectively. To obtain the desired level of doping, the total number of boron atoms to be implanted in the substrate, over the $160 \times 240$ micron area to a depth of 0.5 micron must be about $2.7 \times 10^7$ atoms.

A current density in excess of 1 milliampere per square centimeter can be obtained at orifice 15. Thus about $6 \times 10^9$ ions per second will pass therethrough. With this current density, this first implantation step can be accomplished in .005 second or less.

The second step is the implantation of the discrete regions 44*a* and 44*b*, shown in section of FIG. 4 and in plane view in FIG. 5, with N-type ions, such as phosphorus, to a depth of .05 micron. Implantation of these regions is such that a P-type serpentine track 45 approximately 1 micron wide is left between regions 44*a* and 44*b*. This step is accomplished by sequentially and controllably deflecting ion beams having three different energy levels, 390 kev., 260 kev. and 130 kev., and interrupting the arc current of the ion source each time the image spot comes adjacent to the serpentine track 45 and restoring it on the other side of the serpentine track 45. The process is quite analogous to the production of a black serpentine track on an otherwise white television screen raster.

The dopant concentration required in these regions to produce a meaningful P-N junction is about $10^{19}$ atoms per cubic centimeter. With a beam current density of 10 milliamperes per square centimeter at orifice 15, the implantation of this number of ions would take between 3 and 4 seconds.

Following the N-type ion implantation, the complete removal of the oxide layer over the major portion of the areas 44*a* and 44*b* is necessary in order that ohmic contacts can be made to these implanted regions. Removal of a portion of the oxide of the serpentine track is necessary, in order that a metal contact can be laid down over the track to act as a gate lead.

FIG. 6 is a sectional view of the device after oxide removal.

The techniques for removal or partial removal of the oxide layer comprise using a beam of rare gas ions at about 30 kev. Material removal is at the rate of one or more silicon dioxide molecules per incident ion. About one-quarter of the material in the 116 by 240 micron wide area is removed to provide adequate surface area for low sheet resistance and for contacts. The number of oxide molecules to be removed may be determined from the equation, $$At\frac{d}{m}\times L$$

where A is the area in the square centimeter, $t$ is the oxide thickness, $d$ and $m$ are the density and molecular weight of silica, respectively, and L is Avogadro's number. To achieve the desired removal of the layer 41, about $2.4 \times 10^{13}$ particles are required. A beam current density on the order of 100 milliamperes per square centimeter or $6 \times 10^{17}$ atoms per second per centimeter through orifice 15 will suffice to remove the required amounts of oxide in about 40 seconds. The same technique of beam deflection and source pulsing is used for oxide removal as for implantation of the phosphorous dopant, the difference lying only in the programming of the deflection and the source switching.

Alternately, a pulsed electron source may be used to remove oxide. The higher current densities due to smaller space charge effects obtainable with electron beams permits removal of the oxide layer by local evaporation. Very short removal times about 1 second are accomplished by this technique but close adjustment of the electron beam energy is necessary to prevent damage to the exposed implanted surface.

After the oxide removal step, the silicon slice is indexed to a new position and the process repeated. Repeated indexing of the slice to new positions and repetition of the two implantations and one oxide removal step previously described will cover the slice with identical devices. The slice is then removed and metallized by evaporation coating or by bombardment sputtering to create on the entire slice surface a metallic layer 64 as shown in FIG. 7.

Following this metallizing step, the surface of the slice is lapped to remove all unwanted metal and to leave the slice in the condition shown in section of FIG. 8.

Figures 9, 10:
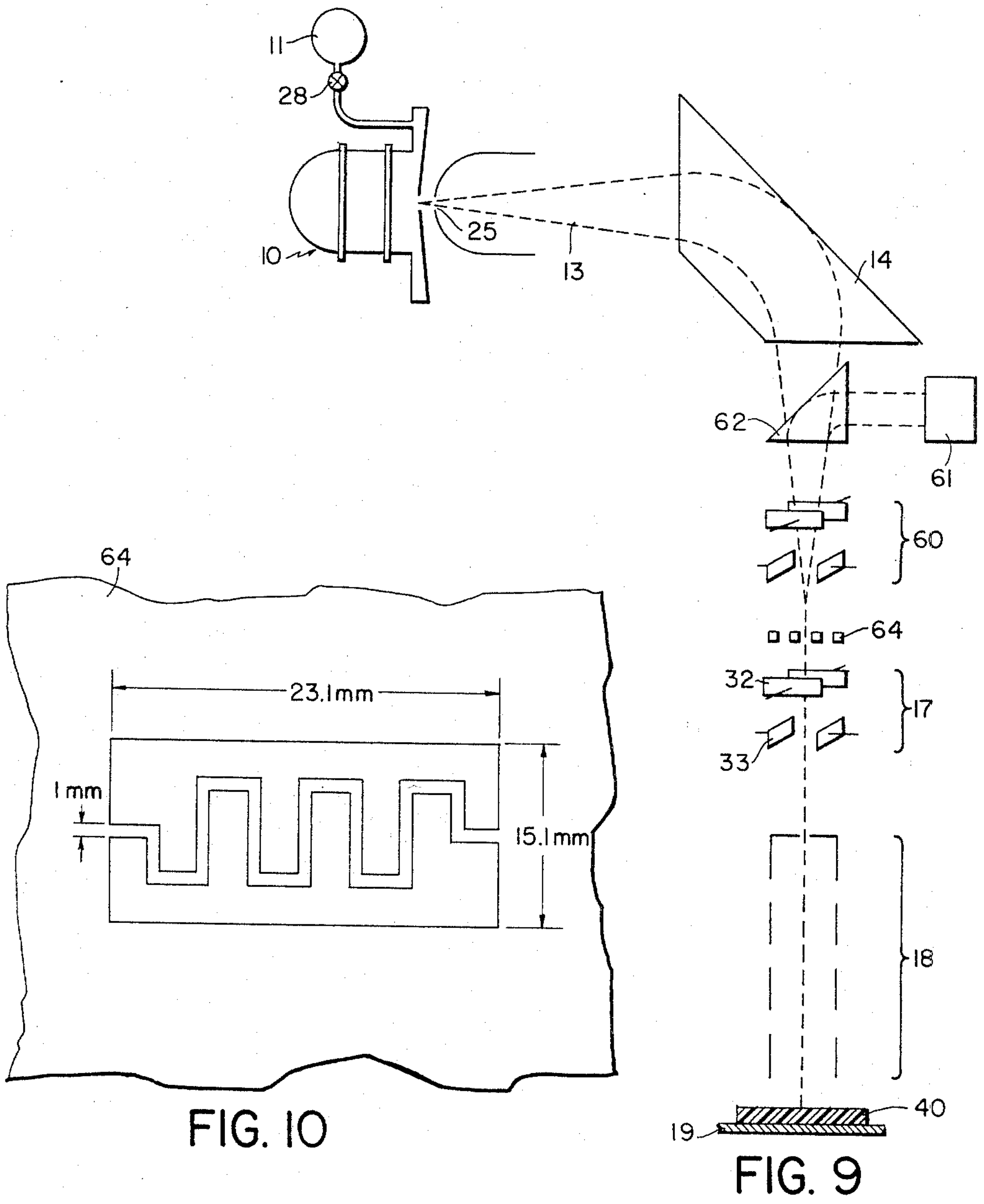
FIG. 9 is a top view of the device of FIG. 8.
FIG. 10 is a schematic view of a further embodiment of the apparatus of the invention.

Instead of programming the same implantation and oxide removal schedule after the slice is indexed, different programming may be used to construct a wide variety of active and passive devices in the sample. These devices may be interconnected by partial removal of the oxide and metallization of the areas in which the oxide was removed in a manner analogous to that explained previously. Thus, integrated circuits of a wide variety of forms can be fabricated and circuit changes made by a variance in the charge particle fabrication program. Such circuit changes can be made without the process of removing, remaking, or fabrication of an expensive mask. FIG. 9 is a schematic view of a further embodiment of the apparatus of the invention. In this arrangement, the aperture 15 of the apparatus of FIGURE 1 is replaced by mask 64, an example of which is shown in FIG. 10. The dimensions of the mask are shown in conjunction with the reduction factor provided by lens 18 to fabricate the required device in sample 40.

For convenience in explanation, these mask dimensions are chosen in conjunction with a lens reduction of 100 to 1 to fabricate the same unipolar device that has been described previously in relation to the apparatus of FIGS. 1 and 2. The sequence of operations is as follows: after placing the oxide coated slice 40 in holder 19, the light implantation schedule of borons as described previously is carried out. Simultaneously, potentials applied to the deflection system 17 cause the apparent position of the mask to shift by plus or minus .5 mm. in 2 orthogonal directions so that an area 24.1 mm. by 16.1 mm. reduced by the lens factor of 100 is substantially, uniformly irradiated by the boron beam.

The second step uses the phosphorus irradiation step described previously but this time the apparent position of the mask 64 is caused by plus or minus .45 mm. in the two perpendicular directions. This results in an implantation pattern of FIGS. 4 and 5, since a serpentine track one micron wide will not be exposed to the phosphorous beam.

The third step is the oxide removal step using the bombardment schedule described previously. For this step, deflection potentials less than that required to produce plus or minus .45 mm. deflection at the plane of the mask are applied. A figure of plus or minus 0.3 mm. might be selected. This step results in the removal of oxide over most but not all of the area immediately above the phosphorus implanted regions. After this step, the section of the device has the appearance of FIG. 6 but without the partial removal of oxide immediately above the serpentine track 45.

A further step is the indexing away of the mask 64 and the substitution of a mask having a 100 micron square aperture. The image of this aperture at the substrate 40 is 1 micron square and as previously described by controllably altering the potentials on the elements of the deflection assembly 17, the beam spot may be traced above the oxide layer 14 immediately over the serpentine track 45 for partial removal of the oxide.

Indexing the substrate 40 successively to new positions and repeating the above-described process, a family of identical devices on a single slice of material will result. After the slice 40 has been covered with devices, it is removed and is processed in accordance with the description previously afforded. In using the apparatus of FIG. 9, relatively uniform illumination of the mask 64 by various charge particle beams is required. This may be accomplished by appropriately defocusing the beam in the plane of the mask or alternately by scanning the beam uniformly over the area occupied by the mask apparatus. For this purpose, an additional deflection assembly 60 is included and appropriate deflection potentials applied to the electrodes. The general advantage of this more complex apparatus is the greater total beam current that can be obtained at the substrate surface, thereby resulting in shorter production times for each of the process steps. Currents on the order of 100 microamperes or more are achievable resulting in fractional second process times for each of the implantation and oxide removal steps.

Furthermore, if desired an electron beam source 61 can be associated with this apparatus. The beam from source 61 passes through magnet 62 which focuses the beam onto the mask 64.

Having now completed the description of several embodiments of the invention, it will become apparent and obvious to those skilled in the art that variations and modifications may be made herein. It is therefore respectfully requested that the invention be limited only by the following claims.

I claim:

1. The method of producing a solid state semiconductor device consisting of the steps of passivating the surface of a slice of semiconductor material, extracting an ion beam from an ion beam generator, accelerating the extracted beam, magnetically analyzing and coarsely focusing the extracted beam, passing the analyzed and coarsely focused beam through a mask to accurately define the focused beam, passing the defined beam through a deflection system and an electrostatic focusing system to image the mask on the surface of the slice and programming the deflection system to direct the beam across the surface of the slice to modify the slice by implanting in the slice a selected concentration of said ions.

2. The method of claim 1 wherein there is further provided the steps of stopping said ion beam, extracting a different ion beam from a beam generator, accelerating, analyzing and coarsely focusing the extracted beam, passing the beam through the mask, deflecting and second focusing system and applying to the system a different program to direct the different beam across the implanted slice to further implant in the slice a selected concentration of said different ions.

3. The method of claim 1 wherein there is further provided the steps of stopping said different ion beam, extracting an electron beam from an electron beam source, passing said electron beam through said mask, deflection and second focusing system, applying to the system a different program to deploy said electron beam on said passivated surface to machine away a portion of said passivated surface overlying the ion implanted slice so that electrical connections can be made to said slice and making electrical connections to said slice.

4. The method of producing a solid state semiconductor device comprising the step of oxidizing the surface of a slice of semiconductor material, to form thereon an oxide layer, extracting an ion beam from a plasma generator, analyzing the extracted beam, passing the analyzed beam through a mask and a deflector, focusing and reducing system, programming the system to direct the ion beam across the surface of the oxidized slice to implant in the slice under the oxide layer a selected concentration of ions, stopping said ion beam, extracting a charged particle beam from a charged particle source, passing the charged particle beam over selected portions of said implanted areas to machine away said oxide layers, and making metallic electrical connections to said implanted areas.

5. The method of claim 4 wherein a plurality of different ion beams are sequentially extracted from the generator, passed through different masks, and the same deflection, focusing and reducing systems, and deployed on said slice to implant in the slice concentrations of different ions.

6. The method of producing an integrated semiconductor device by forming on the surface of a slice of semiconductor material a single, uniform, integral oxide layer, sequentially deploying a plurality of charged particle beams through the same defining apparatus and manipulating means on to the oxidized surface of the slice to implant in the slice below the oxide concentrations of different conductivity ions thereby forming in said slice at least one P-N junction.

References Cited

UNITED STATES PATENTS

| | | | |
|---|---|---|---|
| 2,787,564 | 4/1957 | Shockley | 148—1.5 |
| 2,803,569 | 8/1957 | Jacobs et al. | 148—1.5 |
| 2,842,466 | 7/1958 | Moyer | 148—1.5 |
| 2,902,583 | 9/1959 | Steigerwald. | |
| 3,179,542 | 4/1965 | Quinn et al. | |
| 3,326,176 | 6/1967 | Sibley | 148—1.5 X |
| 3,328,210 | 6/1967 | McCaldin et al. | 148—1.5 |
| 3,340,601 | 9/1967 | Garibotti | 148—1.5 X |

L. DEWAYNE RUTLEDGE, *Primary Examiner.*

R. A. LESTER, *Assistant Examiner.*

U.S. Cl. X.R.

148—1.5, 186; 29—576; 317—235